United States Patent [19]

McAuliffe et al.

[11] Patent Number: 5,243,273

[45] Date of Patent: Sep. 7, 1993

[54] GENERAL PURPOSE, RECONFIGURABLE SYSTEM FOR PROCESSING SERIAL BIT STREAMS

[75] Inventors: Robert E. McAuliffe, Loveland; Christopher B. Cain, Longmont; John E. Siefers, Ft. Collins, all of Colo.

[73] Assignee: Hewlett-Packard Company, Palo Alto, Calif.

[21] Appl. No.: 918,474

[22] Filed: Jul. 22, 1992

Related U.S. Application Data

[63] Continuation of Ser. No. 581,604, Sep. 12, 1990, Pat. No. 5,150,048.

[51] Int. Cl.⁵ .............................................. G01R 31/28
[52] U.S. Cl. ............................... 324/158 R; 324/73.1; 371/15.1; 371/22.1
[58] Field of Search ...................... 324/73.1, 158 R; 371/15.1, 22.1, 22.6

[56] References Cited

U.S. PATENT DOCUMENTS

| | | | |
|---|---|---|---|
| 4,125,763 | 11/1978 | Drabing et al. | 324/73.1 |
| 4,317,199 | 2/1982 | Winslow . | |
| 4,763,124 | 8/1988 | Kovacs et al. | 324/73.1 |
| 4,964,124 | 10/1990 | Burnett | 371/15.1 |
| 5,072,178 | 12/1991 | Matsumoto | 371/22.1 |
| 5,081,626 | 1/1992 | Scott | 371/22.1 |

Primary Examiner—Ernest F. Karlsen

[57] ABSTRACT

Disclosed is a system for testing serial communications electrical circuit boards which interfaces to a board being tested through a plurality of serial channels. The system contains a plurality of personality modules, each of which can interface directly to a channel. A personality module will perform level shifting, data encoding/decoding, line termination, and clock/framing extraction as needed for a particular serial protocol. The system also contains one or more reconfigurable bit processors which may be connected together in a building block fashion to perform low-level processing on serial data received from or sent to a personality module. One of a plurality of serial test sequencers receives or sends data from/to a reconfigurable bit processor; provides a user programmable means to control the application and reception of test patterns to and from a channel; and interfaces to the user through a system controller.

3 Claims, 17 Drawing Sheets

FIG. 10

1006 → FLBBBBBBBEDAFNBBBBBBED   BBBBBBBBEDSBBBBBBEDL
1004 → HL10101110E1AFN111001110   0101010E1S10101100EOL
1002 →

FIG. 11

B1        B2
1106 → BBBBBBBB  BBBBBBBDD
1104 → 10101110  11100111O
1102 →

GENERAL PURPOSE, RECONFIGURABLE SYSTEM FOR PROCESSING SERIAL BIT STREAMS

CROSS REFERENCE TO RELATED APPLICATION(S)

This is a continuation of copending application Ser. No. 07/581,604 filed on Sep. 12, 1990 now U.S. Pat. No. 5,150,048.

FIELD OF THE INVENTION

This invention relates to Electronic Testing and more particularly to testing of circuit cards and components. Even more particularly, the invention relates to testing of serial telecommunications circuit cards and components.

BACKGROUND OF THE INVENTION

It is important that electronic components and printed circuit boards be tested after the components have been soldered to the printed circuit boards. Several different approaches have been developed for testing the components and printed circuit boards, including in-circuit testing, manufacturing defect analyzers, and functional testing.

In-circuit testing techniques have been used to individually test the components on the printed circuit board to determine if these components are working properly. This process uses a "bed of nails" tester to access each individual component and test that component independently. In this manner, non-functioning components can be identified and replaced to prevent the entire circuit board from being scrapped. This process works well for simple components where the circuit inside the component is known and can be easily tested. If the component being tested is very complex, or if the circuit inside the component is unknown, incircuit testing may not achieve satisfactory results.

Manufacturing defect analyzers are another class of testing devices that provide simpler tests and are less expensive to implement. These devices are designed to locate manufacturing faults, such as shorts on a printed circuit board, missing integrated circuits, bent component pins, etc. Although these devices do a reasonably good job of finding shorts and gross analog faults, they are marginal when testing digital sections of the board.

Functional testing uses a procedure of applying predetermined input signals and monitoring the output of a printed circuit board to determine if all of the components are present and operating properly on the circuit board. A stored pattern functional tester is one that applies a digital stimulus to the input pins of the device under test (DUT), waits a predetermined amount of time, then examines the state of the DUT output pins. This architecture was well suited to the early needs of digital board testing, since most of the early DUT's were composed of discrete SSI logic gates and performed simple combinatorial or state machine functions. Because of the simplicity of the DUTs being tested, the tester architecture was a good match to the DUT.

With the introduction of the microprocessor, DUTs having a bus structured architecture became common. Various test enhancements came about in an attempt to make tests for these boards easier to write: memory emulation, bus emulation, and microprocessor emulation, for example. The goal of each of these enhancements was to remove from the test programmer the burden of dealing with the DUT in its low-level, native environment.

DUTs now have faster and more powerful microprocessors, multiprocessing technology, serial communications channels, mixed signal functions, and a variety of custom circuitry such as application specific integrated circuits (ASICs). These technologies tax the capability of a single sequencer, stored pattern test architecture; that is, the tester architecture is no longer a good match to the architecture of the device under test.

We are in the midst of a communications explosion. Local area networks area networks (LANs), wide area networks (WANs), public packet switch networks (PPSNs), and now integrated services digital networks (ISDNs), are being implemented on a large scale in an attempt to keep pace with the communications needs of the world. The design of these networks revolves heavily around serial communications channels and the process of transmitting information through these channels. There are also more specialized types of serial communications applications, such as disk drives, automotive control systems, and aircraft control systems. Today's board testers have trouble with many of the elements of the serial communications technology. For example, the signals within telecommunications can assume not just two states, but sometimes three or four logic states or levels. The serial bit streams are often self-clocking and the clock must be recovered from the bit stream and used to demarcate data bit boundaries. Communications channels may be bit multiplexed, wherein bits that are logically associated with one another are separated in time by bits of other channels. Bits from each channel must be reassembled into a coherent, meaningful flow of information before testing can be performed.

A DUT in this type of system will often have several serial communications channels on a single board. These channels are not only separate physical interfaces, but are functionally separate as well, wherein each channel is controlled by an associated process running on the DUT. These processes may be controlled by a common microprocessor, separate microprocessors, algorithmic state machines or special VLSI parts. From the view of the external world, each channel appears as an independent, self-contained communications channel. A single sequencer, stored pattern tester architecture has great difficulty testing a DUT having several separate channels and processes running asynchronously.

Boards may also be designed with several identical channels that perform the same processing. In order to efficiently test such a board in a timely manner, all channels need to be exercised in parallel. A signal sequencer architecture has great difficulty with testing a plurality of parallel identical processes.

Many standards have been developed in serial communications, for example RS/232, IEEE 802.3 Ethernet, ISDN, etc. General purpose testers must be reprogrammed to deal with each of these standards, since they do not have built-in test capability for these standards.

There is need in the art then for a test system that is capable of testing serial cards having a plurality of channels each of which may be controlled by a different process. There is further need in the art for a tester capable of testing a board having a plurality of identical channels, wherein all channels can be tested in parallel.

Another need in the art is to provide such a system with built-in testing capability for commonly used serial communication protocols. The present invention satisfies these and other needs in the art.

SUMMARY OF THE INVENTION

It is an aspect of the present invention to provide a test system for testing complex combinations of complex circuits.

It is another aspect to provide such a system with a high reusability of hardware and software elements from test to test.

Another aspect is to provide such a system that has built-in testing capability for commonly used serial communication protocols.

Another aspect of the invention is to provide a system capable of testing a multi-processing environment having a plurality of channels possibly controlled by a plurality of processors.

A further aspect is to provide testing capability that can be easily used to test multiple identical channels.

A still further aspect is to provide a plurality of reconfigurable, programmable, modules capable of processing serial data at high bit rates.

The above and other aspects of the invention are accomplished in a serial test card (STC) system that connects to a device under test (DUT) through four serial physical channels. These channels carry transmit and receive data, clock signals, frame signals, and control signals to and from the DUT. The function of each of the signals depends on the characteristics of the serial channel and is controlled by a personality module located within the STC. Each of the four channels may also be multiplexed giving additional serial test channels.

In serial communications, a single physical channel is often made up of one or more logical channels. Physical channels also may present difficult electrical interface problems. While many serial communications schemes are similar, they all generally have slightly different line terminations, nominal voltage levels, and other parametric specifications. The STC addresses these test problems with three basic resources: personality modules (PMs), reconfigurable bit processors (RBPs), and serial test sequencers (STSs).

A personality module (PM) is a small circuit used to interface directly to a DUT physical channel. The personality module will perform level shifting, data encoding/decoding, line termination, and clock/framing extraction as needed for a particular serial protocol.

A reconfigurable bit processor (RBP) is a serial bit stream "filter" element. An STC contains more than one RBP, and the RBPs may be strung together in a user specified building block fashion to perform low-level processing on serial bit streams. Typically, one or more RBPs are connected between a PM and an STS. The RBPs perform such functions as channel splitting, that is demultiplexing a physical channel into multiple logical channels, and layer one protocol processing, such as HDLC bit stuffing, framing, and cyclic redundancy checking. Each RBP is implemented with a programmable gate array containing an internal RAM, which is used to program the gate array and allow the functionality of the RBP to change from test to test. The configuration of the programmable gate array, and thus the functionality, is controlled by loading "circuitware" into the internal RAM on the gate array. This concept allows the RBP to be part of a general serial bit stream processing architecture that can be easily tailored to specific protocols.

A serial test sequencer (STS) provides a user programmable means for the user to control the application and reception of test patterns to and from a DUT logical and/or physical channel. Through the STS, the user has programmatic control of buffered frames of high-level data; the personality modules and reconfigurable bit processors handle the tedious low-level processing so often encountered with serial communication protocols. Multiple STSs are available on a single STC. Also, multiple STSs can gain access to a given physical channel, allowing simultaneous access to multiple logical channels within that physical channel.

Four personality modules connect the four serial interfaces to the device under test. Each of the four personality modules can connect to one or more STS modules. Each STS module contains four reconfigurable bit processors and two serial test sequencers. The flow of data between personality modules, through the reconfigurable bit processors, and to the serial test sequencers is programmable by the serial test sequencers. The combination of the personality modules, reconfigurable bit processors, serial test sequencers, and flexible interconnection provide a very powerful test system for serial bit stream circuits.

BRIEF DESCRIPTION OF THE DRAWINGS

The above and other objects, features, and advantages of the invention will be better understood by reading the following more particular description of the invention, presented in conjunction with the following drawings, wherein:

FIG. 10 shows a detailed diagram of the ISDN signal of FIG. 9;

FIG. 11 shows a detailed diagram of the STS interconnect bus signal from the personality module of FIG. 9;

FIGS. 15A through 16C show a flowchart of the software contained in the STSs for performing the test of the ISDN circuit.

DESCRIPTION OF THE PREFERRED EMBODIMENT

Figure 1:
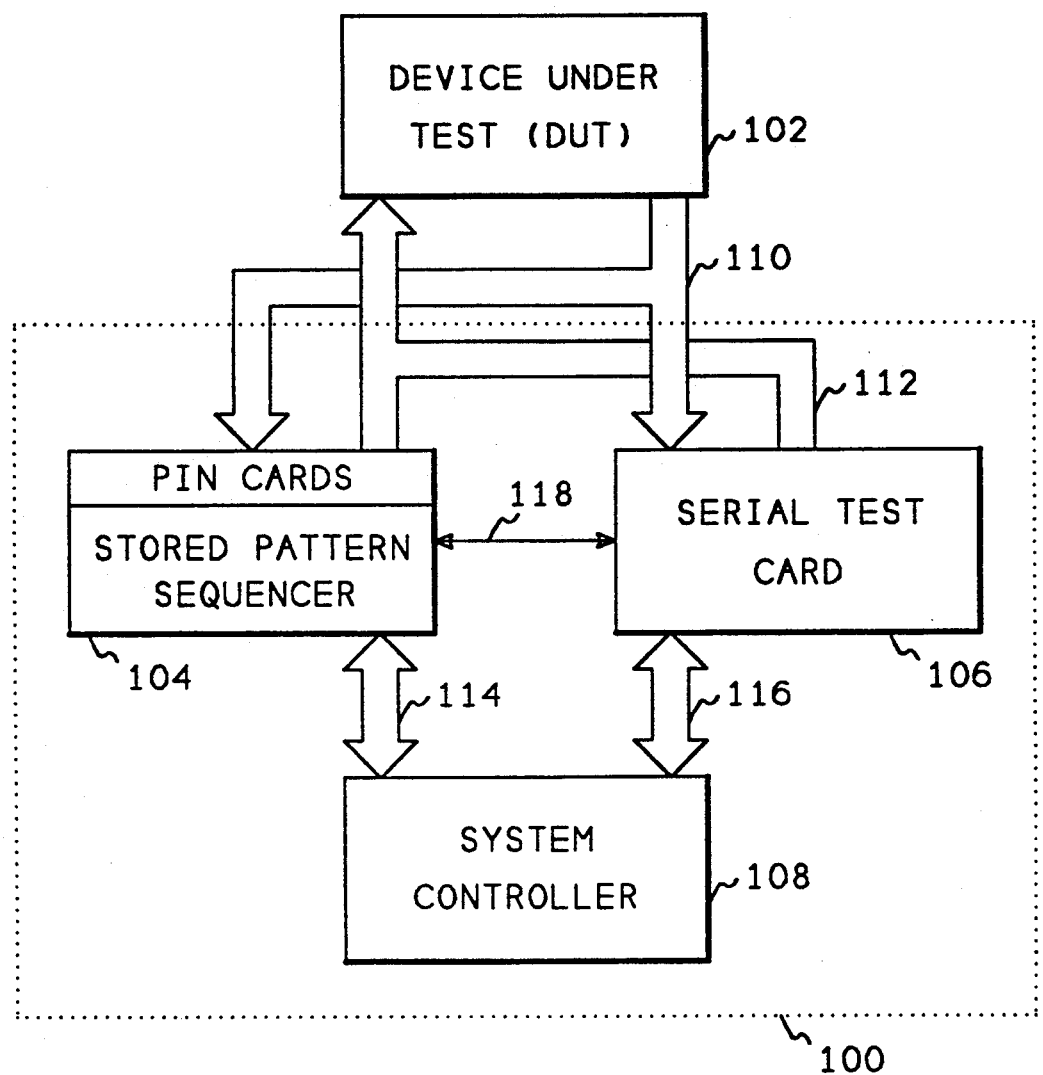
FIG. 1 shows a block diagram of the invention and its incorporation into a general purpose board test device.

The following description is of the best presently contemplated mode of carrying out the present invention. This description is not to be taken in a limiting sense but is made merely for the purpose of describing the general principles of the invention. The scope of the invention should be determined by referencing the appended claims.

The present invention is a test system that is used with a conventional board test device to test boards having complex digital logic, particularly boards that have serial communication circuits. The conventional board test device provides a general purpose computer and a user interface, while the present invention, contained within the board test device, provides a flexible reconfigurable architecture that allows testing of complex serial communication boards. The architecture is general enough to interface to a multitude of specific serial bit stream formats and protocols, yet specific enough to meet the requirements unique to serial communications test applications.

The present invention, called the serial test card (STC), will connect to the device under test (DUT) through four serial physical channels. Each physical channel is composed of up to eight logical signals. These signals carry transmit and receive data, clock signals, frame signals, and control signals to and from the DUT. The function of each of the eight signals is determined by the personality of the serial channel. Some personalities might use all eight of the signals explicitly; others use a subset of the signals or combine multiple signals into one physical line. In addition, there are special cases where multiple serial channels may be combined to provide more than eight signals per channel. The characteristics of a channel are controlled by a personality module located within the STC.

In serial communications, a single channel is often made up of one or more logical channels. For example, the ISDN basic rate Sbus is composed of two B-channels, a D-channel, and a maintenance channel. Testing a physical channel such as the ISDN basic rate channel is usually much simpler if each of these logical channels can be dealt with separately from the others. This is especially true when a high-level protocol such as HDLC is running on one of the logical channels. Physical channels also present difficult electrical interface problems. While many serial communications schemes are similar, they all generally have slightly different line terminations, nominal voltage levels, and other parametric specifications. The STC addresses these test problems with three basic resources: personality modules, reconfigurable bit processors, and serial test sequencers.

A personality module is a small circuit used to interface directly to a DUT physical channel. The personality module will perform level shifting, data encoding/decoding, line termination, and clock/framing extraction or insertion as needed for a particular physical protocol. Physically, a personality module is a separate printed circuit board that houses the circuitry designed to provide the interface between the particular physical protocol of the device under test, and the internal protocol used within the STC.

A reconfigurable bit processor (RBP) is a serial bit stream "filter" element. An STC contains more than one RBP, and the RBPs may be connected together in a building block fashion to perform low-level processing on serial bit streams. The RBPs perform such functions as channel splitting, that is, de-multiplexing a physical channel into multiple logical channels, and layer one protocol processing, such as HDLC bit stuffing, framing, and cyclic redundancy checking. Each RBP has an identical pin-out, which allows them to be strung together in a user specified fashion. Only the functionality, i.e. "filtering action" of the RBP need change from application to application. Each RBP is implemented with a programmable gate array having an internal RAM, which is used to program the gate array. The configuration of the programmable gate array, and thus the functionality, is controlled by loading "circuitware" into the internal RAM of the gate array. This concept allows the RBP to be part of a general serial bit stream processing architecture that can be easily tailored to specific protocols.

A serial test sequencer (STS) provides a means for the user to control the application and reception of test patterns to and from a DUT logical and/or physical channel. Through the STS, the user has programmatic control of buffered frames of high-level data; the personality modules and reconfigurable bit processors handle the tedious low-level processing of the serial communication protocols. Access to low-level data is still available in debug and diagnostic modes. Eight STSs are available on a single STC. Up to four STSs can gain access to a given physical channel, allowing simultaneous access to four logical channels within that physical channel. RBPs are generally connected between the personality modules and the STSs. There are sixteen RBPs available on an STC, four for each pair of STSs.

The interconnection of the personality modules, reconfigurable bit processors, and serial test sequencers, will be described below with respect to the figures.

FIG. 1 shows a block diagram of the invention and its incorporation into a general purpose board test device. Referring now to FIG. 1, a board test device 100 is used to test the circuits of a device under test 102. More than one device under test may be tested simultaneously. The board test device 100 contains a system controller 108 which provides general purpose computer functions and a user interface to the user of the board test device. A stored pattern sequencer and pin cards module 104 connects to the device under test through a stimulus bus 112 and a response bus 110. The stored pattern sequencer module 104 provides in-circuit test functions where they are needed to test the device under test. The stored pattern sequencer 104 is connected to the system controller over a bus 114. The system controller 108 and the stored pattern sequencer 104 are of conventional design and are readily available from several manufacturers. One such device is the Model 3070 manufactured by the Hewlett-Packard Company of Palo Alto, Calif.

The serial test card 106 of the present invention is designed to provide complex testing of the device under test 102. It sends input signals to stimulate the device under test through a stimulus bus 112 while receiving response signals from the DUT over a response bus 110. The serial test card 106 communicates to the system controller, and thus to the user, over a host bus 116. A board test device 100 may have a plurality of serial test cards 106, which communicate with each other and with the stored pattern sequencer 104 over the trigger bus 118. Although the stored pattern sequencer 104 and the system controller 108 are of conventional design, they complement the testing provided by the serial test card 10 of the present invention.

Figure 2:
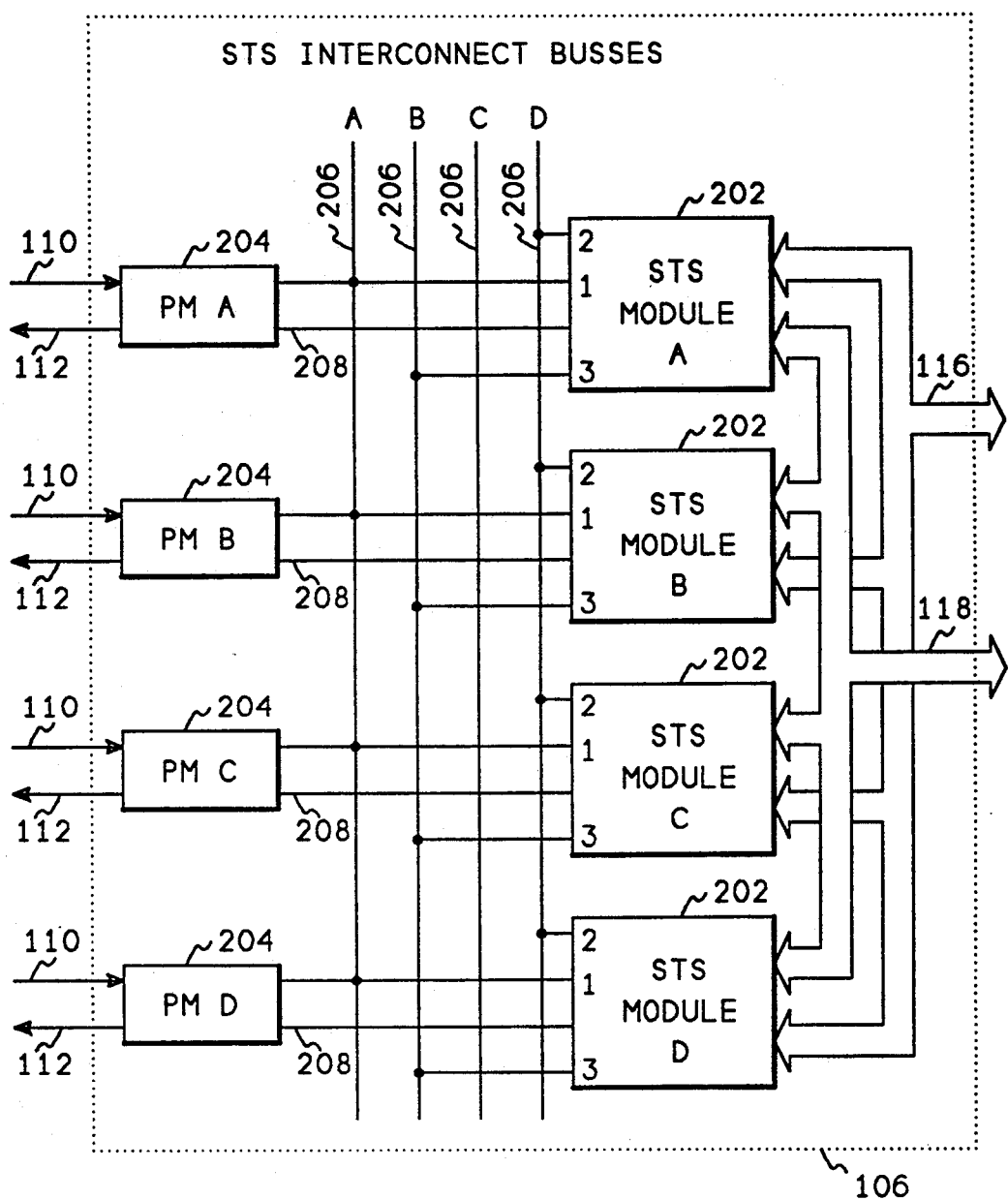
FIG. 2 shows a block diagram of the serial test card of FIG. 1.

FIG. 2 shows a block diagram of the serial test card 106 of FIG. 1. Referring now to FIG. 2, the serial test card 106 contains four personality modules 204 which are connected to four STS modules 202. The connections between the personality modules 204 and the STS modules 202 are made through four STS interconnect buses 206 and a programming bus 208. The STS modules 202 connect to each other through the trigger bus 118 and to the system controller (FIG. 1) over the host bus 116. Communications between the personality modules 204 and the device under test are accomplished through the stimulus bus 112, to which each of the personality modules 204 are connected, and a response bus 110, also connected to all four personality modules 204.

The unique serial interconnect architecture of the STS modules and the personality modules allow software control of the serial transmit and receive data path configurations. Each of the four STS interconnect buses 206 is actually made up of three distinct sub-buses: the transmit data bus, the receive data bus, and the control bus. The control bus includes the signals that implement the control/status bus as well as the interrupt lines from the personality modules 204. As shown in FIG. 2, each personality module 204 connects to only one of the STS interconnect buses 206. Each STS module 202, however, connects to three of the STS interconnect buses 206. This allows considerable flexibility, all accomplished through programming software, in connecting the STS modules to the device under test, through up to three personality modules 204.

A programming bus 208 is used to send programming information to programmable gate arrays in the personality modules. Each of the STS modules 202 sends programming information to one of the personality modules 204.

Figure 3:
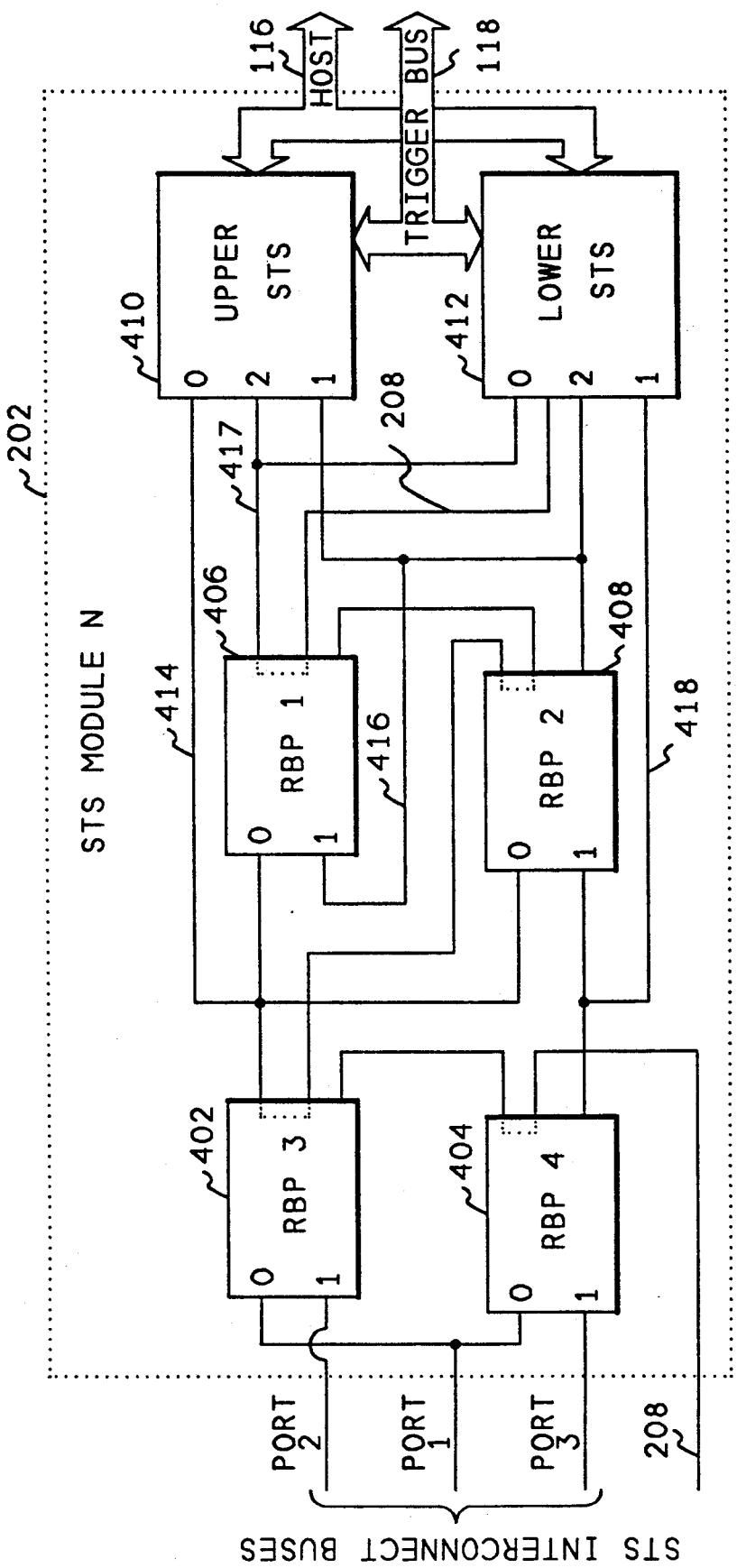
FIG. 3 shows a block diagram of the STS module of FIG. 2.

FIG. 3 shows a block diagram of the STS module 202 of FIG. 2. Referring now to FIG. 3, the STS module 202 contains four reconfigurable bit processors 402, 404, 406, and 408, and two serial test sequencers 410 and 412. The RBPs and the STSs are interconnected with four STS interconnect buses 414, 416, 417, and 418. The interconnection of the STSs and the RBPs is configured by selecting an active downstream port, zero or one, for each RBP and an active port, zero, one, or two, for each STS.

The unique serial interconnect architecture of the STS module and personality modules within the STC allow software control of the serial transmit and receive data path configurations. Serial data from the DUT passes through a personality module and one or more RBPs, on its way to one or more STSs. The exact path the data takes on its journey is determined by the programming of the serial interconnect and by the particular functionality programmed into the personality modules and RBPs.

The four STS interconnect buses 414, 416, 417, and 418 allow the four RBPs 402, 404, 406, and 408 to be interconnected in various ways. For example, the STS module 410 could pass output on port zero over STS interconnect bus 414 to the input of RBP module 402 whose output could go directly to either port two or port one of the STS module 202. STS module 410 could, however, send output on its port two to RBP module 406 which could send output on its port one over STS interconnect bus 416 to RBP module 408 which in turn sends output on port zero to RBP module 402 to send output over either port two or port one of the STS module 202, thus using three RBP modules in sequence.

The programming bus 208 is used by the lower STS 412 to send programming information to each of the RBPs 402, 404, 406, 408, and to the personality module connected to the STS module. This bus carries serial data and is "daisy-chained" to each of the RBPs and to the PM.

Figure 4:
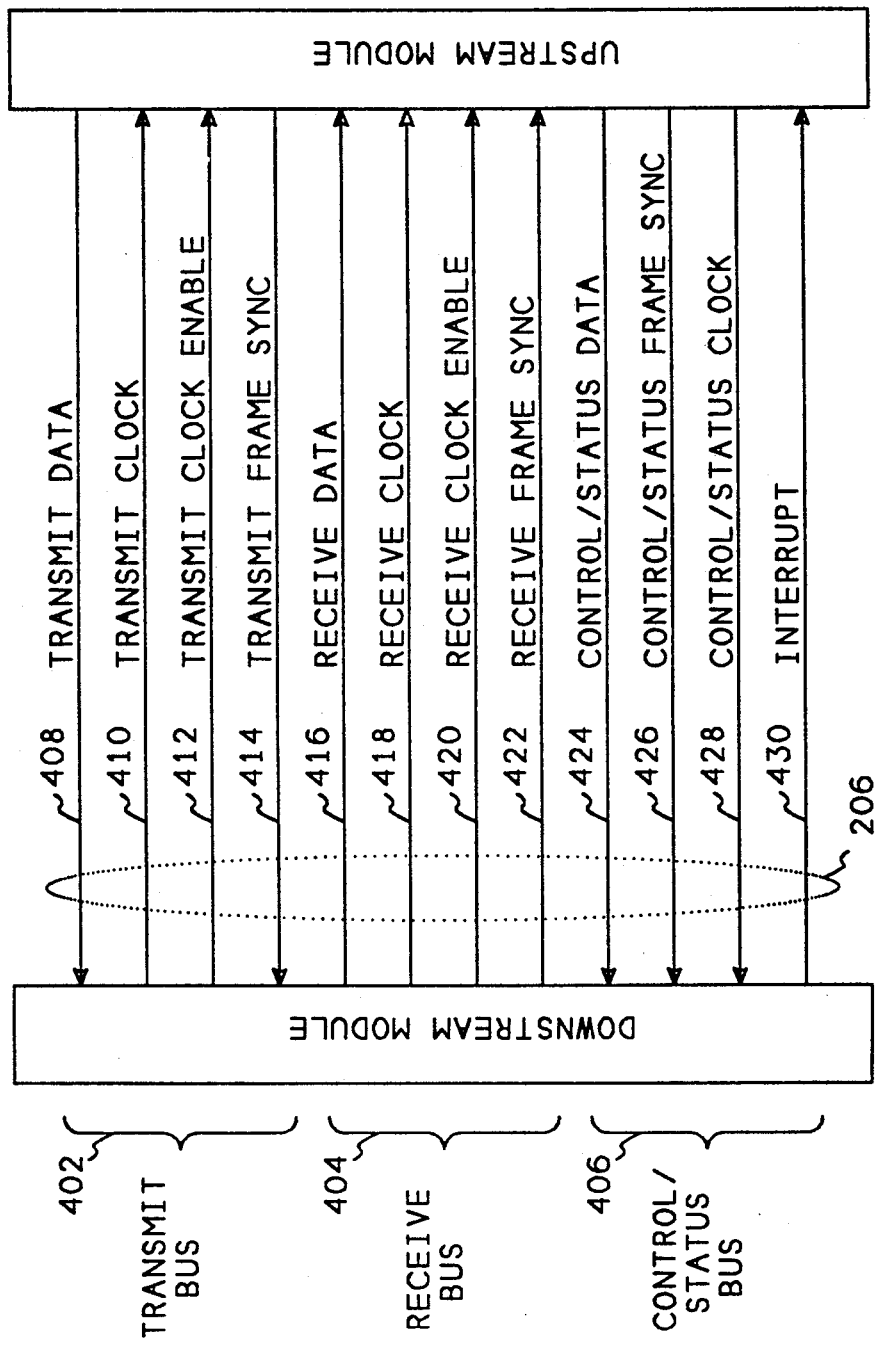
FIG. 4 shows a block diagram of the STS interconnect buses of FIG. 2.

FIG. 4 shows a diagram of the STS interconnect bus 206 of FIG. 2. Referring now to FIG. 4, the three sub-buses that make up the STS interconnect bus, the transmit bus 402, the receive bus 404, and the control/status bus 406, are each shown having a plurality of signals. Within the transmit bus 402, the Transmit Data (TD) signal 408 contains the serial data bits being sent over the transmit bus from the upstream module to the downstream module. Either an STS or an RBP can be an upstream module, while an RBP or a PM can be a downstream module. A Transmit Clock (TCL) signal 410 is a continuous clock that defines when the bits on the Transmit Data (TD) signal 408 are valid. A Transmit Clock Enable (TCE) signal 412 is used to define when the transmit clock is valid and thus identifies when transmit data can be clocked. A Transmit frame Sync (TFS) signal 414 defines the start and end of each frame. The receive bus 404 has a set of signals that correspond to the transmit bus 402 signals. A Receive Data (RD) signal 416 contains the serial bit stream that is being received. The Receive Clock (RCL) signal 418 defines where each bit in the receive data signal occurs, and the Receive Clock Enable (RCE) signal 420 defines when the receive clock is valid and thus identifies when the RD signal 416 can be clocked. The Receive Frame Sync (RFS) signal 422 defines the first and last bit of each frame within the RD signal 416.

The control/status bus 406 contains a Control/Status Data (C/SD) signal 424 which contains the serial bits of the control or status data. A control/status clock (C/SCL) signal 428 defines each bit on the C/SD signal 424, and a Control/Status Frame Sync (C/SFS) signal 426 defines the beginning of each frame within the C/SD 424. An Interrupt signal 430 allows a downstream module to interrupt an STS.

The STC is typically used to test DUTs where two or more asynchronous processes operate simultaneously. Communication between processes requires signalling between STS processors within the STC and between the STC and the controller 108. The STC trigger bus 118 meets these communications requirements.

STSs may be programmed to monitor or generate trigger signals on the trigger bus 118 for other STSs or the system controller 108. The trigger bus is implemented as a serial data highway having a sixty-four time slot frame structure. Each time slot contains four bits, and the aggregate data rate is five megabits per second. Since there are four bits per time slot, and sixty-four time slots per frame, a frame contains two hundred fifty-six bits. A low-going pulse during the two hundred fifty-sixth bit of the frame delimits each individual frame.

Figure 5:
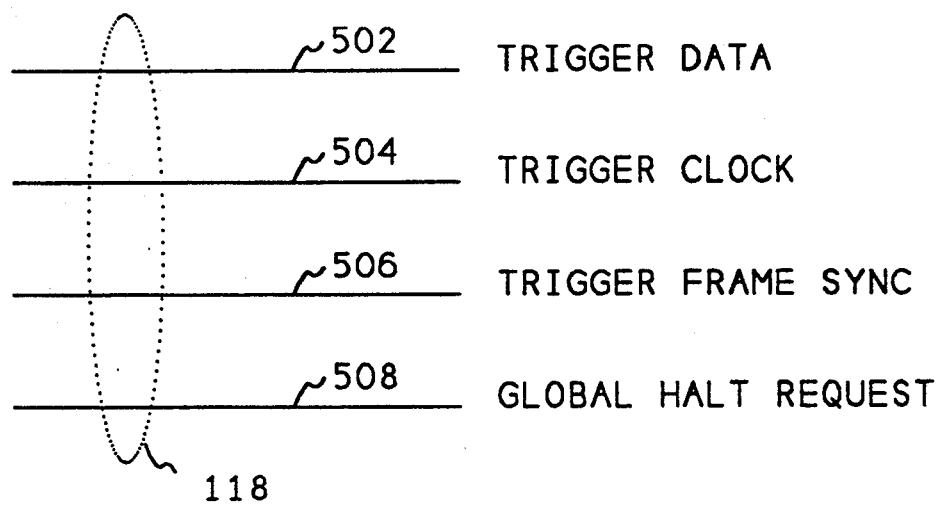
FIG. 5 shows a block diagram of the trigger bus of FIG. 3.

The trigger bus 118 (FIG. 1) enables communications between the STS blocks 410 and 412 (FIG. 3), between multiple STS modules 202, and between the STS module 202 and the system controller 108, as well as between multiple serial test cards 106, if a test device 100 contains multiple serial test cards 106. FIG. 5 shows a diagram of the trigger bus 118 of FIG. 1. Referring now to FIG. 5, the trigger bus 118 contains a Trigger Data signal 502 which carries the serial data that is on the trigger bus 118. A Trigger Clock signal 504 defines each bit of data on the trigger data signal 502 and a Trigger Frame Sync signal 506 defines the beginning and end of each frame of information on the trigger data bus 502. A global halt signal 508 is used to stop processing throughout the test device. Each STS is allocated a slot within each frame of the trigger bus 118 Each STS uses its slot to send trigger information to other STSs.

Figure 6:
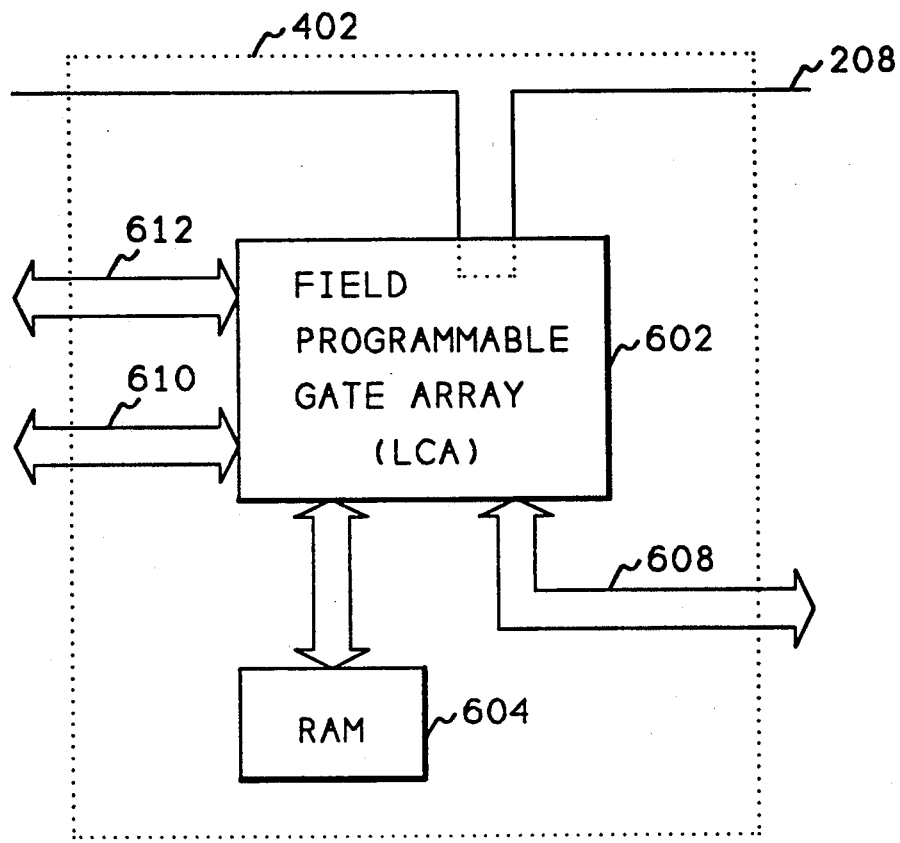
FIG. 6 shows a block diagram of the RBP module of FIG. 3.

FIG. 6 shows a block diagram of the RBP module of FIG. 3. Referring now to FIG. 6, an RBP module 402 contains a field programmable gate array 602 also called a logic cell array (LCA) which is an industry standard part, such as XILinx 3000 family of logic cell array, manufactured by XILinx, Inc. of San Jose, Calif. The programming instructions for the field programmable gate array 602 are stored in an internal random access memory after being sent over the programming bus 208. Two identical STS interconnect bus downstream interfaces 610 and 612 are used to interface this RBP to another RBP or to a personality module. The upstream STS interconnect bus interface 608 may connect to the downstream of another RBP or to an STS.

Figure 7:
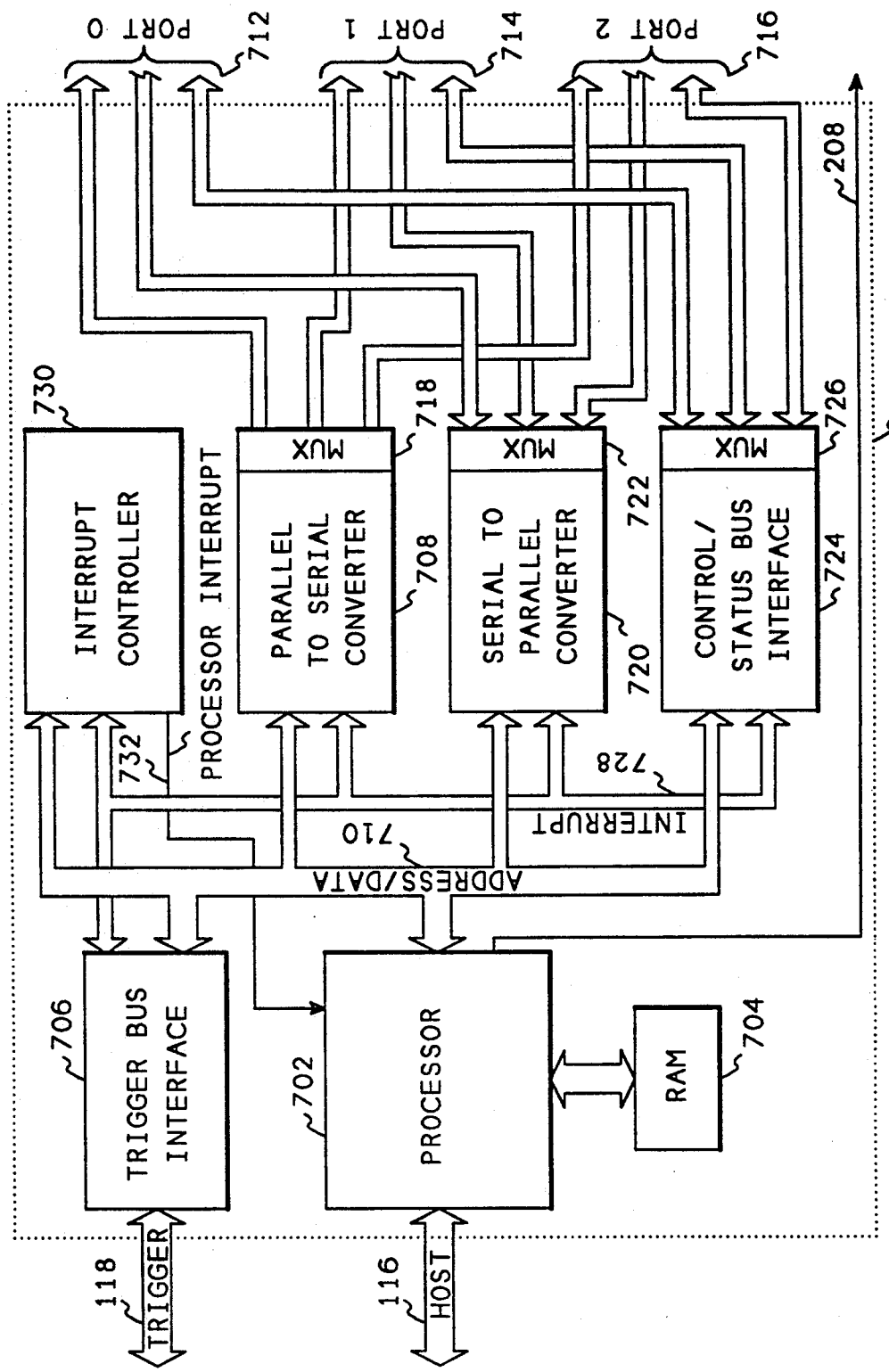
FIG. 7 shows a block diagram of the STS block of FIG. 3.

FIG. 7 shows a block diagram of the two identical STS blocks of FIG. 3. Referring now to FIG. 7, the STS 404 contains a processor 702 which is used to process user instructions stored in a random access memory 704. The host bus 116 is used by the processor to interface to a user through the controller 108. A trigger bus interface 706 is used by the processor 702 to communicate over the trigger bus 118 to other STSs. A parallel to serial converter 708 is used to convert parallel data from the processor address/data bus 710 into serial data for transmission onto one of the ports 712, 714, or 716 which are connected to STS interconnect buses 414, 416, 417, and 418. A multiplexor 718 is used by the processor 702 to select the specific port 712, 714 or 716 for use. A serial to parallel converter 720 is used by the processor 702 to receive data from one of the ports 712, 714, or 716, and a multiplexor 722 is used to select the specific port. A control/status bus interface 724 is used by the processor 702 to communicate over the control/status lines of one of the ports 712, 714, or 716. The specific port is selected by multiplexor 726. An interrupts bus 728 is used to take interrupt signals from the bus controllers 708, 720, and 724, and all downstream modules, as well as the trigger bus interface 706 to an interrupt controller 730. The interrupt controller 730 prioritizes the interrupts and provides a processor interrupt signal 732 to the processor 702. A programming bus 208 is used to send programming information to the RBPs and the PMs.

Every serial bit stream has four properties: physical specifications, symbol synchronization method, framing method, and bit group identification.

The physical specifications describe the electrical properties of the bit stream and the number or logic levels or states defined for the bit stream.

Since a serial bit stream is inherently composed of bits, each bit stream has a way of delimiting the bit boundaries within the bit stream. A module receiving the bit stream uses symbol synchronization methods to locate these bit boundaries. The symbol synchronization method of the bit stream is either explicit, having a dedicated signal wire to define the boundary of each the symbol, or implicit, having symbol synchronization information encoded into the serial data and transmitted over the same physical wire as the data.

In addition to grouping bits into symbols within a serial bit stream, symbols are usually grouped into frames. Therefore, in addition to a symbol synchronization method, a serial bit stream usually has a frame synchronization method. As with symbol synchronization methods, framing synchronization methods can be either explicit, having a dedicated signal wire to define the frame, or implicit, wherein the framing information is encoded with the serial data and transmitted over the same physical wire. An implicit framing method may use either a bunched framing pattern or a distributed framing pattern. A bunched framing pattern is made up of a group of contiguous bits, whereas a distributed pattern is made up of a group of bits interspersed with the data bits. The time interval between the end of one frame and the beginning of the next is called the interframe gap. This gap may have a length of zero or non-zero. If the length of the gap is non-zero, the gap is filled with an interframe fill pattern.

A serial bit stream often carries more than one independent channel of information simultaneously. This characteristic is also referred to as switching or multiplexing. The multiplexing may be either explicit or implicit. In explicit multiplexing, each frame contains a group of information from each multiplexed channel. The frame boundary provides a reference for the bit groupings. The ISDN signal is an example of explicitly multiplexed bit streams.

In implicit multiplexing, each frame contains a group of information from only one of the multiplexed channels. The channel associated with the information is encoded into the bit stream. An example of implicit multiplexing is the high-level data link control (HDLC) protocol wherein the address field of each frame defines the channel.

The present invention uses a personality module to convert the various serial protocols into a common serial protocol used on the STS interconnect buses 206 (FIG. 2) The personality modules will have several unique designs, one to accommodate each serial protocol being tested. In addition, a personality module may have a programmable gate array which would allow it to be reconfigurable for various protocols. Also, different personality modules may be interchanged within an STC to test different serial protocols. That is, a personality module used for a particular serial protocol may be installed in the board test device 100, and removed when the test is complete.

Figure 8:
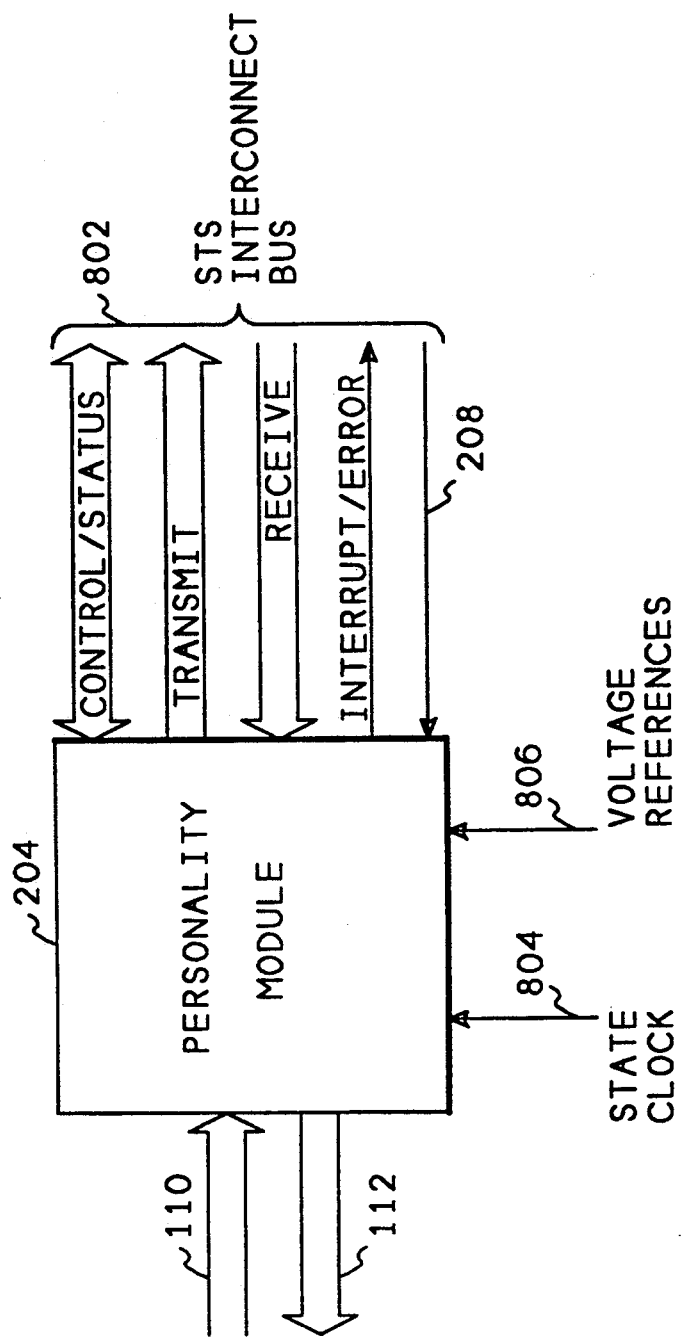
FIG. 8 shows a block diagram of the personality module of FIG. 2.

FIG. 8 shows a block diagram of the personality module of FIG. 2. Referring now to FIG. 8, a personality module 204 contains circuitry which will be uniquely designed for a particular serial protocol. The personality module may also contain one or more field programmable gate arrays, also called logic cell arrays (LCAs) which can be programmed from the STSs over a programming bus 208. The personality module 204 uses a stimulus bus 112 to send signals to the device under test and receives response information from the DUT over a response bus 110. A STS interconnect bus interface 802 is used by the personality module 204 to connect to one of the STS interconnect buses 206 (FIG. 2). A state clock 804 and voltage references 806 are also supplied to the personality module 204.

Figure 9:
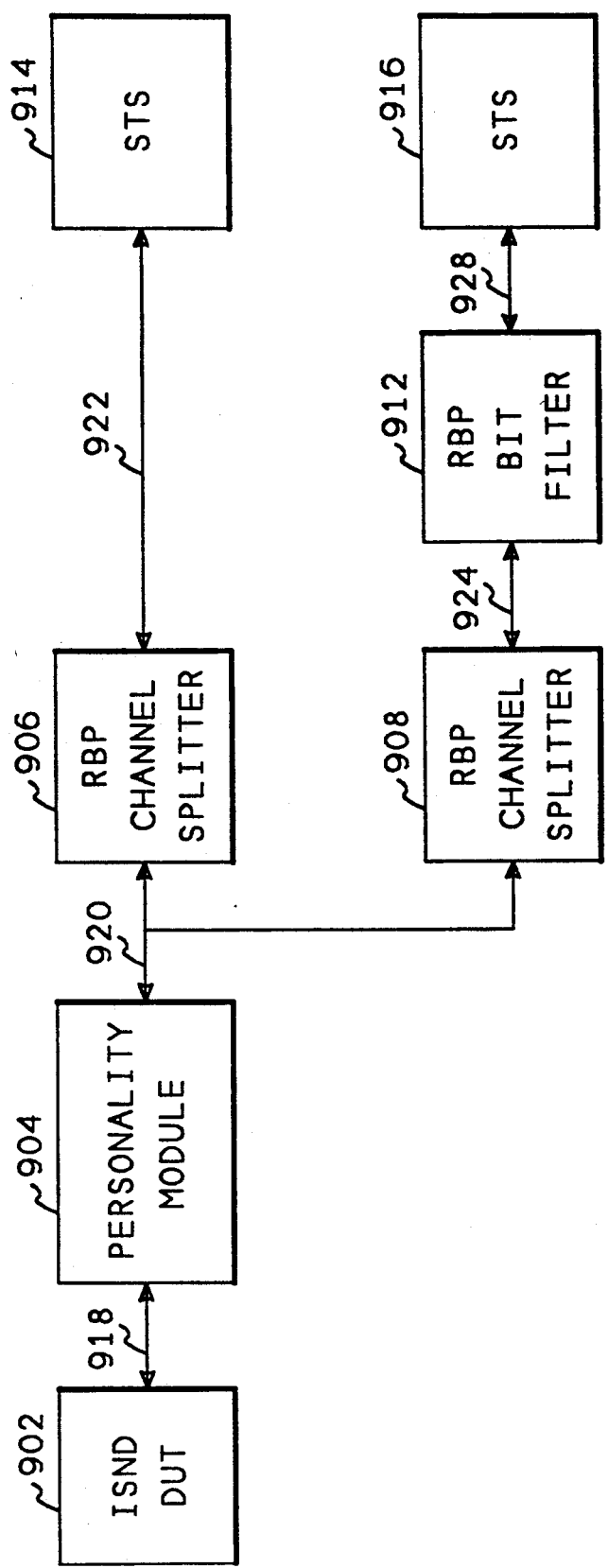
FIG. 9 shows a block diagram of the serial test card configured as a tester for an ISDN device under test.

FIG. 9 shows a block diagram of the serial test card configured as a tester for an ISDN device under test. Referring now to FIG. 9, the ISDN device under test card 902 provides a serial signal 918 which is connected to a personality module 904. The personality module 904 converts the ISDN signal on the interface 918 into a STS interconnect bus format suitable for the bus 920 and sends this signal to a pair of RBPs 906 and 908, each configured as a channel splitter. The RBP channel splitter 906 extracts the two B channels, B1 and B2, from the ISDN signal and sends this signal over STS interconnect bus 922 to an STS 914. RBP channel splitter 908 extracts the D channel from the ISDN signal and sends this channel over a STS interconnect bus 924 to an RBP 912 configured as a bit filter. The RBP bit filter 912 extracts address, control, and data information from the D channel and sends this information over a STS interconnect bus 928 to an STS 916. Data is also transmitted from the STS, through the RBPs 906, 908, and 912, and through the PM 904 to the DUT 902.

FIG. 10 shows a detailed diagram of the ISDN signal 918 of FIG. 9. Referring now to FIG. 10, an ISDN signal which is present on the DUT interface 918 (FIG. 9) is shown graphically as a three state logic signal 1002. Details of the makeup of an ISDN signal can be found in CCITT "Recommendations of the Series I, Integrated Services Digital Network (ISDN)", *CCITT Redbook*, Vol. 3, Fascicle III.5, 1985. The mnemonics that represent the signal levels shown in the diagram 1002 are shown above the diagram as a series of binary characters and letters 1004. Above each of the mnemonics 1004 is a corresponding letter 1006 that identifies the logical channel within the signal 1002.

The basic rate frame ISDN signal, shown above in FIG. 10, contains two B channels and a D channel as well as other information. FIG. 11 shows a detailed diagram of the signal on the STS interconnect bus 920 of FIG. 9. Referring now to FIG. 11, the signal shown is the result of the personality module 904 extracting all extraneous information except for the two B channels and the D channel information contained in the basic rate frame ISDN signal. The PM 904 has also converted the tri-level signal shown in 1002 (FIG. 10) of the ISDN signal 918 into a binary signal on the STS interconnect bus 920 a illustrated by the graphic 1102. Above the graphic 1102 is the mnemonic representation 1104 of the graphic signal 1102. Above the mnemonic representation 1104 is a description of the logical channel containing each of the binary bits. Although not shown in FIG. 11, the PM 904 has extracted the implicit clocking and framing information form the ISDN signal and converted this information to explicit clock and framing information on the STS interconnect bus 920.

The signal on STS interconnect bus 920, shown in FIG. 11, is connected to the channel splitter 906. The channel splitter 906 extracts the B channel information from the STS interconnect bus 920 and sends only the B channel data onto the STS interconnect bus 922 to the STS 914. The STS 914 then programmatically analyzes the B channel data to determine the results of the test.

The STS interconnect bus 920, which contains the signal shown in FIG. 11, is also connected to a channel splitter 908. The channel splitter 908 extracts only the D channel information from the signal shown in FIG. 11 and feeds this D channel information over the STS interconnect bus 924 to a bit filter 912. The bit filter 912 contains circuitware which extracts address, control, and data information from the D channel and sends this information over the STS interconnect bus 928 to a second STS 916. The second STS 916 tests the information separately from the B channel information tested by the STS 914.

Figure 12:
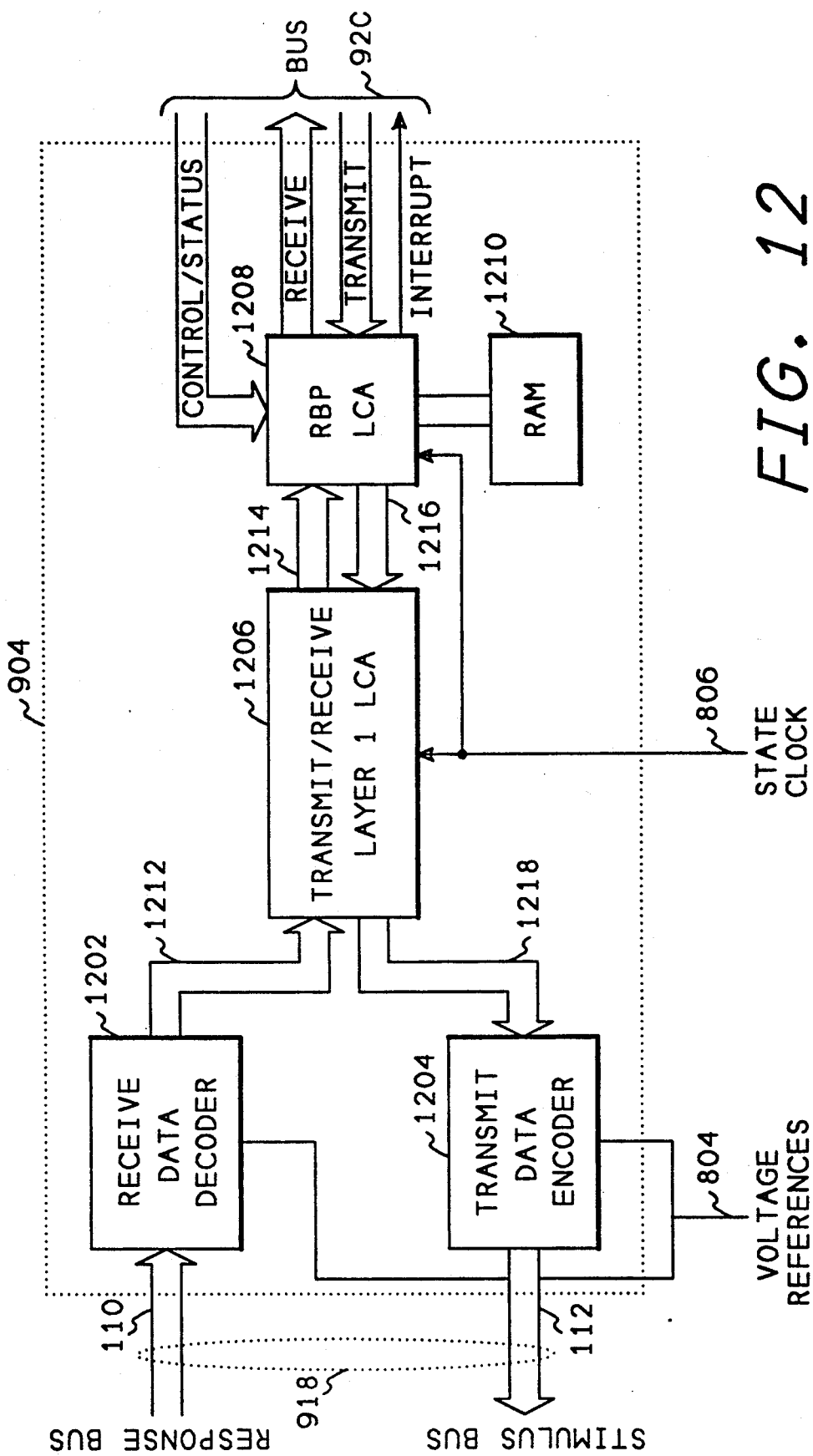
FIG. 12 shows a block diagram of the personality module of FIG. 9.

FIG. 12 shows a block diagram of the personality module of FIG. 9. Referring now to FIG. 12, data from the device under test enters the personality module 904 over a response bus 110 and is received by a receive data encoder 1202. As described above with respect to FIG. 10, the data on the response bus 110 is in a tri-level format. The receive data encoder 1202 converts the tri-level format of the data on response bus 110 to a binary TTL format and sends this data over an internal bus 1212 to a transmit/receive Layer 1 LCA 1206. The Layer 1 processor 106 extracts clock and frame synchronization information from the ISDN signal and sends this separate information, along with the ISDN data, over an internal bus 1214 to the RBP LCA 1208. The RBP LCA 1208 removes all logical channel information from the ISDN signal except the B and D channels which are sent over the receive section of the STS interconnect bus 920 to the channel splitters 906 and 908. When transmit information is received over the transmit section of the STS interconnect bus 920, the RBP LCA adds any necessary channels to make this information complete for the ISDN bus and passes this over an internal bus 1216 to the transmit/receive Layer 1 LCA 1206. The Layer 1 processor 1206 takes the external clock information from the bus 1216 and imbeds it into the ISDN signal and passes the complete ISDN signal over an internal bus 1218 to the transmit data encoder 1204. The transmit data encoder 1204 converts the signal from the internal binary TTL level of the bus 1218 to a tri-level format suitable for sending to the DUT over the stimulus bus 112.

Figure 13A:
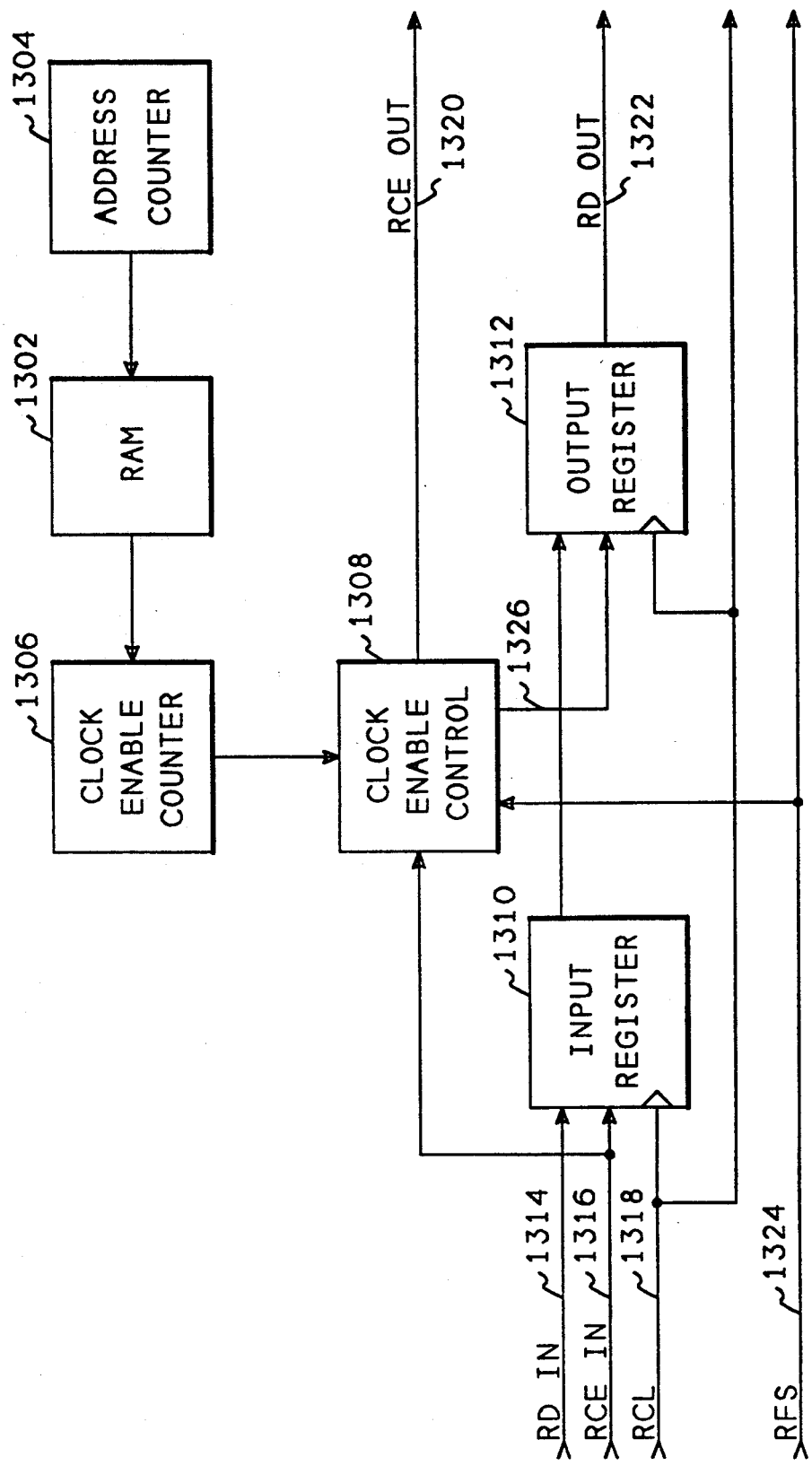
FIGS. 13A and 13B show a block diagram of the channel splitter modules of FIG. 9.
Figure 13B:
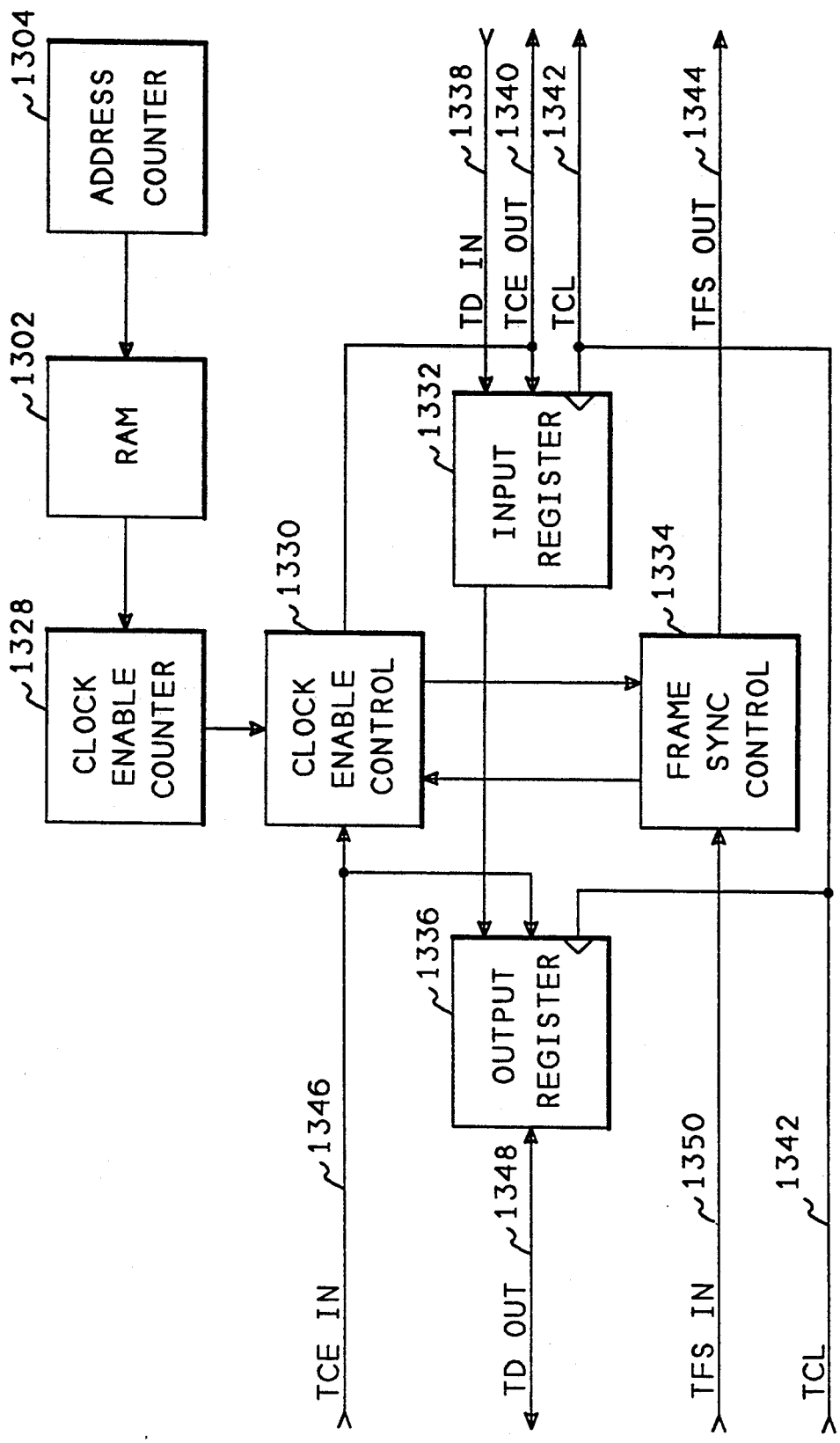

FIGS. 13A and 13B show a block diagram of the RBP channel splitter which is used for both the B channel splitter 906 (FIG. 9) and the D channel splitter 908 (FIG. 9). The personality module 904 (FIG. 9) has removed everything from the ISDN signal except the B and D channel data, and this data is sent over bus 920 to the RBP channel splitter 906 and the RBP channel splitter 908. The channel splitters will remove the unwanted data from the stream and pass the desired data directly through to the STSs. Therefore, the circuitry for both channel splitter 906 and channel splitter 908 are the same. Control information is sent by the STS 916 to identify whether the B or D channel is to be stripped. The following description will describe the channel splitter in general, and identify where the control information is stored and used. FIG. 13A shows a block diagram of the receive circuitry within the channel splitters, and FIG. 13B shows a block diagram of the transmit circuitry within the channel splitters. The circuits represented by these block diagrams are formed by the STSs sending programming information to the programmable gate arrays within the RBPs which cause the gates within the gate arrays to be connected to form the circuits.

Referring now to FIG. 13A, Receive Data In (RD IN) signal 1314 is connected to an input register 1310. Also connected to the input register 1310 is the Receive Clock Enable In (RCE IN) signal 1316 and the Receive Clock (RCL) signal 1318. The RCL signal 1318 will clock the RD IN 1314 into the input register whenever the RCE IN signal 1316 is active. The input register 1310 is connected to the output register 1312 which also receives the RCL signal 1318. The output of the output register 1312 is the Receive Data Out (RD OUT) signal 1322. The clock enable control circuit 1308 receives the RCE IN signal 1316 as well as the Receive Frame Sync (RFS) signal 1324.

Control information identifying whether the B channel or the D channel is to be stripped from the data stream is stored in a RAM 1302, which is addressed by an address counter 1304. This control information is connected to a clock enable counter 1306 which gates the clock enable control 1308 to strip the B or D channel. If the D channel is being stripped, the clock enable counter 1306 will count the first sixteen bits of a frame and cause the clock enable control 1308 to activate the Receive Clock Enable Out (RCE OUT) signal 1320 during the first sixteen bits of a frame causing the B channel data to be sent to the STS 914. During the last two bits of the frame, clock enable control 1308 will deactivate the RCE OUT signal 1320, thus causing the D channel bits of the frame to be stripped from the frame.

If the B channel is being stripped, the control information in the RAM 1302 will be set to cause the clock enable counter and the clock enable control to activate the RCE OUT signal 1320 during the two D channel bits of the frame and deactivate RCE OUT signal 1320 during the sixteen B channel bits of the frame.

FIG. 13B shows the transmit side of the channel splitter. Referring now to FIG. 13B, the address counter 1304 and the RAM 1302 are the same as for the receive side described above with respect to FIG. 13A. Again, control information in RAM 1302 will indicate whether the B channel or the D channel is to be stripped. Transmit Data In (TD IN) signal 1338 is connected to an input register 1332 whose output is connected to an output register 1336. The output of the output register 1336 is the Transmit Data Out (TD OUT) signal 1348. Data is clocked into the input register 1332 by the Transmit Clock (TCL) signal 1342 whenever the Transmit Clock Enable Out (TCE OUT) signal 1340 is active. The clock enable control and the clock enable counter will activate the TCE OUT signal 1340 during either the B channel bits or the D channel bits of the frame depending on the setting of the control information in RAM 1302. The frame sync control circuit 1334 receives the Transmit Frame Sync In (TFS IN) signal 1350, but delays this signal until the first bit is to be transmitted, at which time it activates Transmit Frame Sync Out (TFS OUT) signal 1344.

Figure 14:
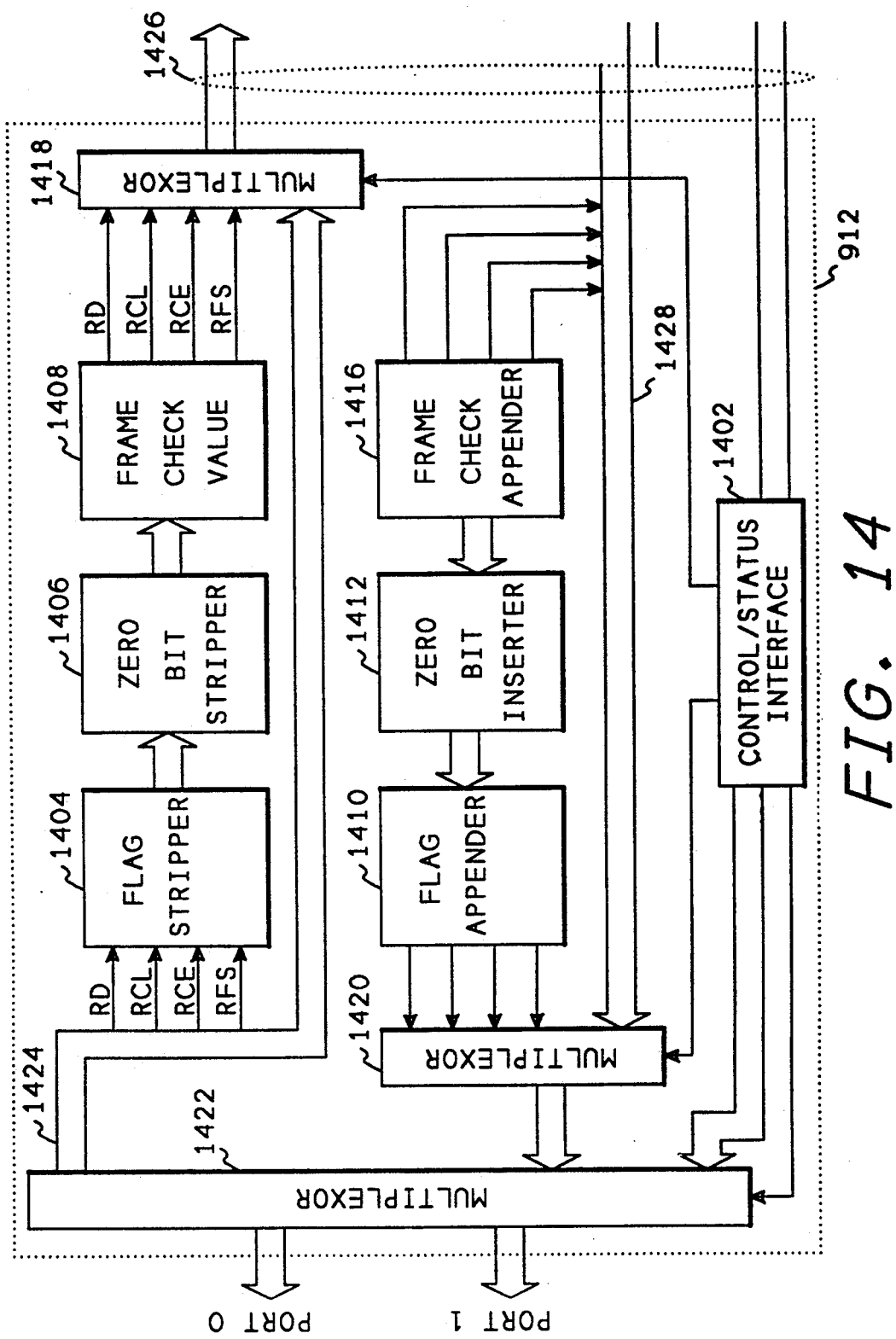
FIG. 14 shows a block diagram of the bit filter of FIG. 9.

FIG. 14 shows a block diagram of the bit filter circuit 912 of FIG. 9. This filter is designed to operate on the D channel of the ISDN signal, which uses a subset of the high-level data link control protocol (HDLC). In the HDLC protocol, flag bytes which delimit frames have six 1 bits. The HDLC protocol does not allow a series of six 1 bits to occur, except during a flag character. At any time six 1 bits would naturally occur in a data stream, the sender of the HDLC data inserts a zero bit after the fifth 1 bit and the receiver removes the zero bit. The HDLC protocol also has frame check sequence information at the end of each frame. A more complete description of the D channel protocol may be found in *ISDN, Concepts, Facilities, and Services*, Gary C. Kessler, McGraw Hill, Inc., 1990, page 88. The circuit represented by the block diagram in FIG. 14 is formed by programming the connections of a programmable gate array in a reconfigurable bit processor. These programming bits are downloaded from the STS module prior to the start of a test.

Referring now to FIG. 14, a control status interface 1402 controls a multiplexor 1422 to select either port zero or port one of the reconfigurable bit processor 912. Receive signals are received over a bus 1424 and connected to a flag stripper 1404 which strips the flag bytes from the beginning and end of each frame. After the flag stripper has removed the flag bytes, the signals are sent to a zero bit stripper 1406 which removes a zero following any fifth bit in the data. This fifth bit was inserted into the protocol to avoid having an erroneous flag byte in the data, therefore, it must be removed when the data is received. After stripping all zero bits, the signals go to the frame check validation block 1408 which checks the frame sequence information at the end of the frame, and then removes this information. The signals are then passed through a multiplexor 1418. The multiplexor 1412 is controlled by the STS through the control status interface 1402 and is used to select the processed data which has been processed by the flag stripper 1404, zero bit stripper 1406, and frame check sequence validation 1408. The multiplexor can also be used to select raw data from the bus 1424 if the user desires to bypass the HDLC processing. After making the selection, the receive data is passed upstream over the bus 1426.

Transmit data is received from the upstream module over bus 1428 and connects to the frame check appender 1416 which adds frame check sequence information to each frame. After the frame check sequence information has been added, the signals are passed to the zero bit inserter 1412 which inserts a zero bit after every sequence of five 1 bits in order to avoid a false flag byte. After the zero bits have been inserted, the signals pass to flag appender 1410 which appends a flag to the beginning and end of each frame. The signals then pass through a multiplexor 1420 which selects between the raw data 1428 or the HDLC processed data and sends the result to the multiplexor 1422 which then sends the data out over port zero or port one depending on which port has been selected by the control status interface 1402.

Figure 15A:
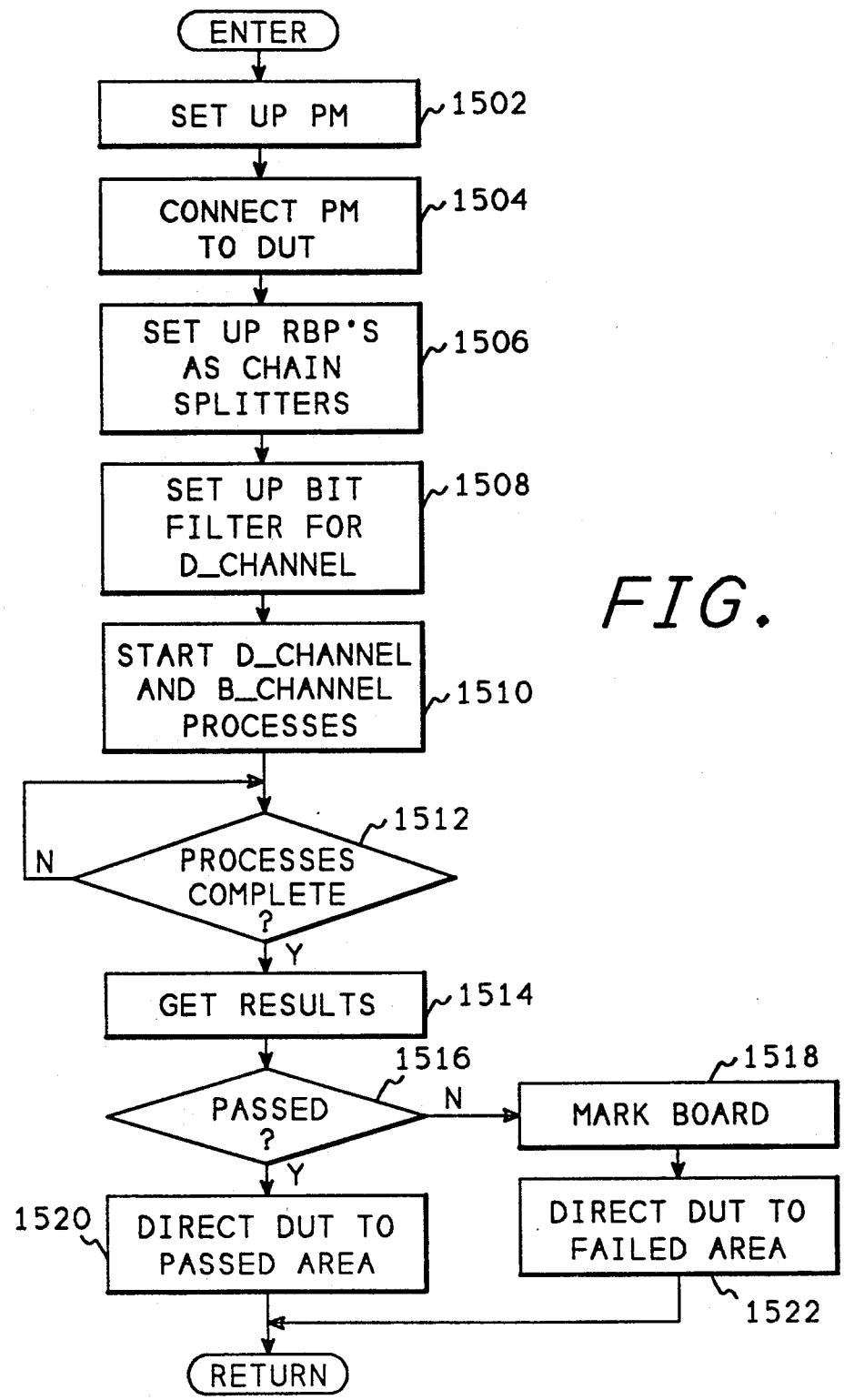
Figure 15B:
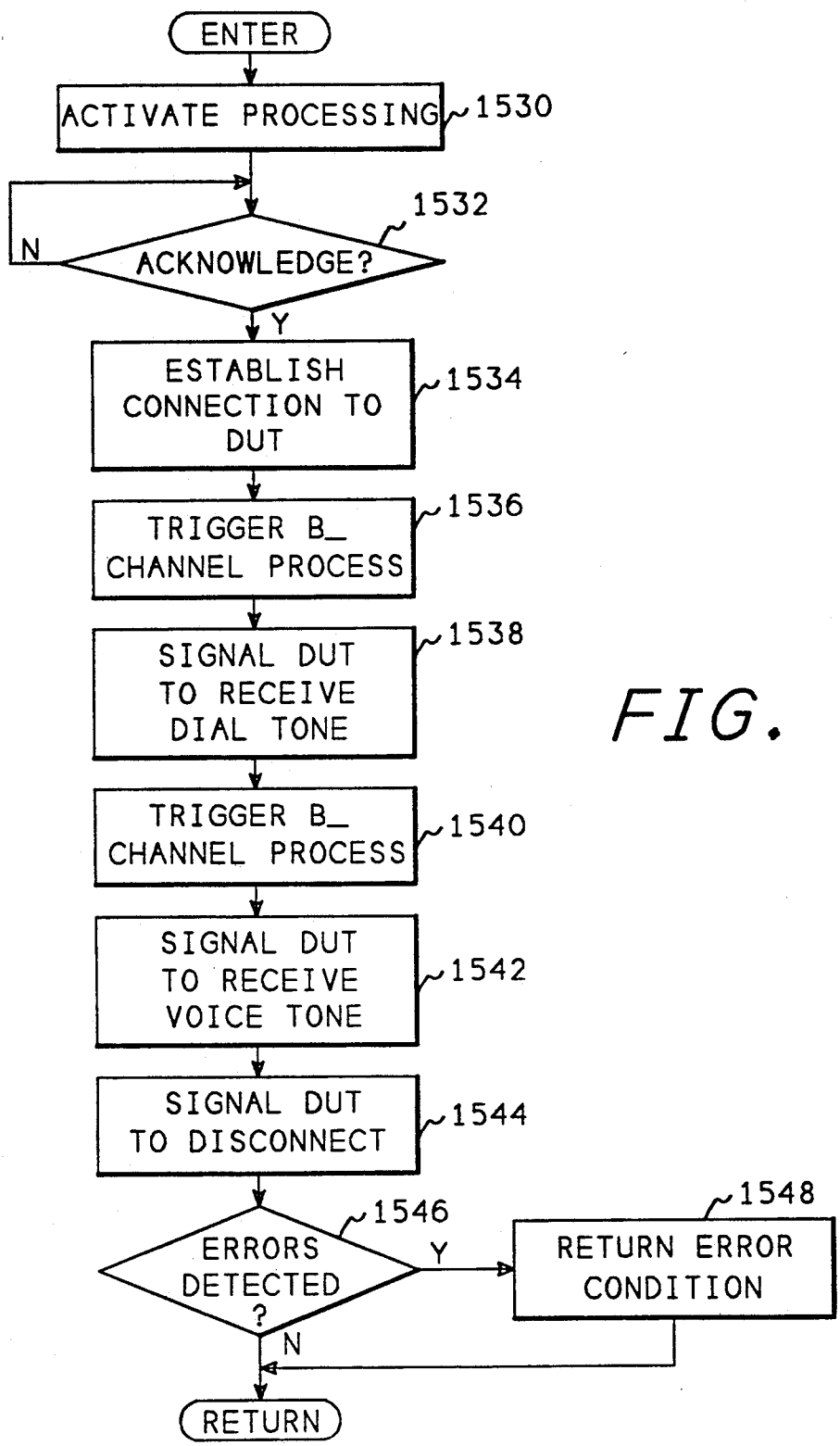
Figure 15C:
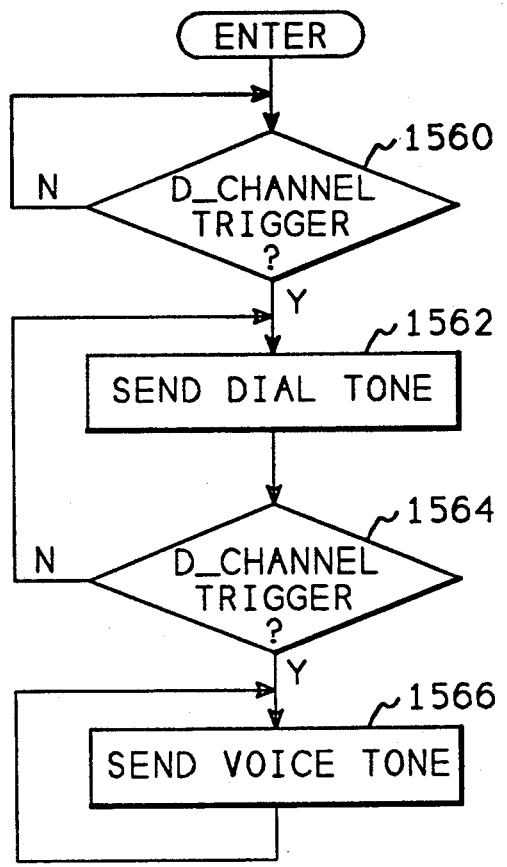

FIGS. 15A through 15C show a flowchart of the software contained in the STSs for performing the test of the ISDN circuit within the DUT 902. FIG. 15A shows the software necessary to set up the STSs, the RBPs, and the personality modules for the test. FIG. 15B shows the processing performed in the STS 916 for processing the D logical channel of the ISDN signal, and FIG. 15C shows the processing performed in STS 914 for the B logical channel of the ISD signal.

Referring now to FIGS. 15A, 15B, and 15C, the software of these figures will be initiated by the system controller 108 (FIG. 1) when the test is started. After entry, block 1502 sets up the personality module 904 by downloading the programming information into the two programmable gate array (LCA) circuits contained on the personality module 904. Block 1504 sends instructions to connect the stimulus and response buses of the personality module 904 to the DUT 902 over the bus 918. Block 1506 then sends the programming code to the RBPs 906 and 908 to set them up as channel splitters. Block 1508 then sends the programming code to the RBP 912 to define it as the bit filter for the D logical channel. Block 1510 sends trigger signals over the trigger bus 118 to start the D channel process of FIG. 15B and the B channel process of FIG. 15C. These processes run in parallel with the remaining code of FIG. 15A. Block 1512 then waits for the processes to complete and block 1514 gets the results of these processes. Block 1516 determines whether the tests have passed and if the tests did not pass, block 1516 transfers to block 1518 which causes the test device 100 to physically mark the boards, typically with an ink stamp, indicating that the board has failed a test. Block 1522 then causes the test device 100 to route the DUT to a failed area within the testing environment. If the tests do pass, block 1516 transfers to block 1520 which directs the board to a passed area within the test environment before returning to its caller.

When block 1510 started the D channel process, control entered this process at block 1530 (FIG. 15A) which activates the processing of the personality module 904, the channel splitters 906 and 908, and the RBP bit filter 912. Block 1532 then waits for an acknowledgement from the processors that the test has started and block 1534 then establishes the connection to the device under test by sending control signals over the D logical channel of the ISDN signal through the bit filter 912, the channel splitter 908, and the personality module 904. Block 1536 then triggers the B channel process to send a dial tone over the B logical channel of the ISDN. Block 1538 then sends information over the D channel to signal the DUT to receive the B channel data. Block 1540 triggers the B channel process to send a voice tone over the B logical channel and block 1542 sends information to DUT over the D logical channel to signal it to receive the voice tone from the B channel. Block 1544 then signals the DUT to disconnect, and block 1546 determines whether any errors were detected. If an error is detected in any communications with the DUT, as above in blocks 1534, 1538, 1542, or 1544, the test will terminate and transfer directly to block 1546. If errors were detected, block 1546 transfers to block 1548 which returns an error condition to the process of FIG. 15A. If no errors were detected, block 1546 returns to its caller.

FIG. 15C shows the B channel process and after entry, block 1560 waits for a trigger from the D channel block 1536. After receiving the trigger, block 1560 transfers to block 1562 which sends a dial tone over the B logical channel of the ISDN signal. Block 1564 then waits for the next trigger signal from block 1540 of the D channel process. While waiting for the second trigger, control transfers back to block 1562 to maintain sending a dial tone over the B logical channel. After receiving the second trigger, block 1564 transfers to block 1566 which sends a voice tone over the B logical channel of the ISDN signal. This block continues processing until the entire test is terminated.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A system for testing a plurality of serial bit stream circuits comprising:
    a plurality of personality module means for connecting said system to said plurality of circuits and for converting a plurality of serial bit stream signal formats of said circuits to a common bit stream signal format;
    a plurality of reconfigurable bit processing means connected to said personality module means for converting between said common bit stream format and a converted bit stream signal format;
    a plurality of bus means connecting said plurality of personality module means and said plurality of reconfigurable bit processing means for conducting said common bit stream signal
    a plurality of programmable serial test sequencing means connected to said plurality of reconfigurable bit processing means for testing said serial bit stream circuit and for identifying said circuit as correctly functioning or rejecting said circuit as defective, wherein one of said plurality of programmable serial test sequencing means is connected to each of said reconfigurable bit processing means; and
    means for simultaneously connecting at least two of said plurality of reconfigurable bit processing means to one of said plurality of personality module means through said plurality of bus means, wherein said at least two of said plurality of reconfigurable bit processing means operate simultaneously to communicate with said one of said plurality of personality module means.

2. A system for testing a serial bit stream circuit comprising:
    at least two personality module means simultaneously connected to said circuit, wherein said at least two personality module means convert at least one serial bit stream signal format of said circuit to a common bit stream signal format;
    a plurality of reconfigurable bit processing means connected to said personality module means for converting between said common bit stream format and a converted bit stream signal format;
    a plurality of first bus means connecting said plurality of personality module means and said plurality reconfigurable bit processing means for conducting said common bit stream signal;
    a plurality of programmable serial test sequencing means connected to said plurality of reconfigurable hit processing means for testing said serial bit stream circuit and for identifying said circuit as correctly functioning or rejecting said circuit as defective; and
    a plurality of second bus means connecting said plurality of programmable serial test sequencing means and said plurality of reconfigurable bit processing means;
    means for connecting at least two of said programmable serial test sequencing means to at least two of said reconfigurable bit processing means through said plurality of second bus means wherein one of said programmable serial test sequencing means connects to one of said reconfigurable bit processing means; and
    means for connecting said at least two reconfigurable bit processing means to said at least two personality module means through said first bus means.

3. A system for testing a serial bit stream circuit comprising:
    a personality module means for connecting said system to said circuit and for converting a serial bit stream signal format of said circuit to a common bit stream signal format;

a plurality of reconfigurable bit processing means simultaneously connected to said personality module means for converting between said at least one common bit stream format and a converted bit stream signal format;

a plurality of first bus means connecting said personality module means and said plurality of reconfigurable bit processing means for conducting said common bit stream signal;

a plurality of programmable serial test sequencing means each connected to one of said plurality of reconfigurable bit processing means for testing said serial bit stream circuit and for identifying said circuit as correctly functioning or rejecting said circuit as defective; and a plurality of second bus means connecting said plurality of programmable serial test sequencing means and said plurality of reconfigurable bit processing means.

* * * * *